United States Patent
Masuo et al.

(10) Patent No.: US 9,361,201 B2
(45) Date of Patent: Jun. 7, 2016

(54) MEMORY SYSTEM AND MEMORY CONTROLLER

(71) Applicant: Kabushiki Kaisha Toshiba, Tokyo (JP)

(72) Inventors: Yoko Masuo, Iruma (JP); Hironobu Miyamoto, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 255 days.

(21) Appl. No.: 13/748,712

(22) Filed: Jan. 24, 2013

(65) Prior Publication Data

US 2014/0047281 A1    Feb. 13, 2014

Related U.S. Application Data

(60) Provisional application No. 61/680,474, filed on Aug. 7, 2012.

(51) Int. Cl.
*G06F 11/34* (2006.01)
*G11C 16/34* (2006.01)
*G11C 29/04* (2006.01)

(52) U.S. Cl.
CPC ........ *G06F 11/3409* (2013.01); *G06F 11/3419* (2013.01); *G11C 16/3495* (2013.01); *G06F 11/3485* (2013.01); *G11C 2029/0409* (2013.01)

(58) Field of Classification Search
CPC .. G06F 12/0246; G06F 3/0688; G06F 3/0611

USPC .......................................................... 714/55
See application file for complete search history.

(56) References Cited

U.S. PATENT DOCUMENTS

| | | | |
|---|---|---|---|
| 2008/0239812 A1* | 10/2008 | Abiko et al. ............. | 365/185.12 |
| 2009/0161466 A1* | 6/2009 | Hamilton et al. ............. | 365/222 |
| 2010/0049907 A1* | 2/2010 | Kitsunai et al. ............... | 711/103 |
| 2012/0030529 A1 | 2/2012 | Roohparvar et al. | |

FOREIGN PATENT DOCUMENTS

| JP | 2002-318729 | 10/2002 |
|---|---|---|
| JP | 2008-305507 | 12/2008 |
| JP | 2010-67284 | 3/2010 |
| JP | 2010-160816 | 7/2010 |
| JP | 2010-533929 | 10/2010 |

* cited by examiner

*Primary Examiner* — Jigar Patel
(74) *Attorney, Agent, or Firm* — Oblon, McClelland, Maier & Neustadt, L.L.P (57) ABSTRACT

According to one embodiment, a memory system includes a NAND-type flash memory and a memory controller. The memory controller includes a monitoring module and a determination module. The monitoring module acquires an elapsed time from the start of data erase of a first block in the NAND-type flash memory. The determination module determines whether the elapsed time has exceeded a reference time before completion of the data write in the first block.

13 Claims, 8 Drawing Sheets

F I G. 1

F I G. 2

| Block ID | Block state | Erase time |
|---|---|---|
| 0 | Active | 5000 |
| 1 | Active | 200000 |
| 2 | Writing | 10000000 |
| 3 | Free | 20000000 |
| 4 | Free | 30000000 |
| ⋮ | ⋮ | ⋮ |

| Block ID | Channel number | Error count C2 |
|---|---|---|
| x | 0<br>1<br>2<br>⋮<br>15 | 0<br>0<br>1<br>⋮<br>0 |
| y | 0<br>1<br>2<br>⋮<br>15 | 0<br>0<br>0<br>⋮<br>0 |
|  |  |  |

MEMORY SYSTEM AND MEMORY CONTROLLER

CROSS-REFERENCE TO RELATED APPLICATIONS

This application claims the benefit of U.S. Provisional Application No. 61/680,474, filed Aug. 7, 2012, the entire contents of which are incorporated herein by reference.

FIELD

Embodiments described herein relate generally to a memory system and a memory controller.

BACKGROUND

There is conventionally known a NAND-type flash memory as a rewritable nonvolatile memory.

In a memory system including a NAND-type flash memory, each of a plurality of blocks needs to erase data already written in the block before data write in the block.

On the other hand, to guarantee the reliability, it is necessary for the NAND-type flash memory to detect, before the occurrence of an error, a block with a high probability of write error occurrence.

DETAILED DESCRIPTION

Various embodiments will be described hereinafter with reference to the accompanying drawings.

In general, according to one embodiment, a memory system comprises a NAND-type flash memory serving as a non-volatile (non-transitory) memory, and a memory controller. The NAND-type flash memory comprises a plurality of blocks. Each of the plurality of blocks is a unit of erase that needs to erase data already written in the block for data write in the block. The memory controller comprises a timer configured to measure a time, a table, a monitoring module, a determination module, and a block switching module. The timer starts measuring the time in accordance with activation of the memory system. Erase time information is stored in the table. The erase time information represents a time at which data erase of a first block in the NAND-type flash memory has started in order to write data in the first block. The monitoring module acquires a difference between the time of the timer and the time represented by the erase time information stored in the table as an elapsed time from the start of the data erase of the first block. Based on whether the elapsed time has exceeded a reference time before completion of the data write in the first block, the determination module determines whether a probability that an error occurs in the data write in the first block due to an interrupt of the data write is high. Upon determining that the probability that the error occurs is high, the block switching module switches a write destination block from the first block to a second block that is in a data unwritten state in the NAND-type flash memory.

First Embodiment

Figure 1:
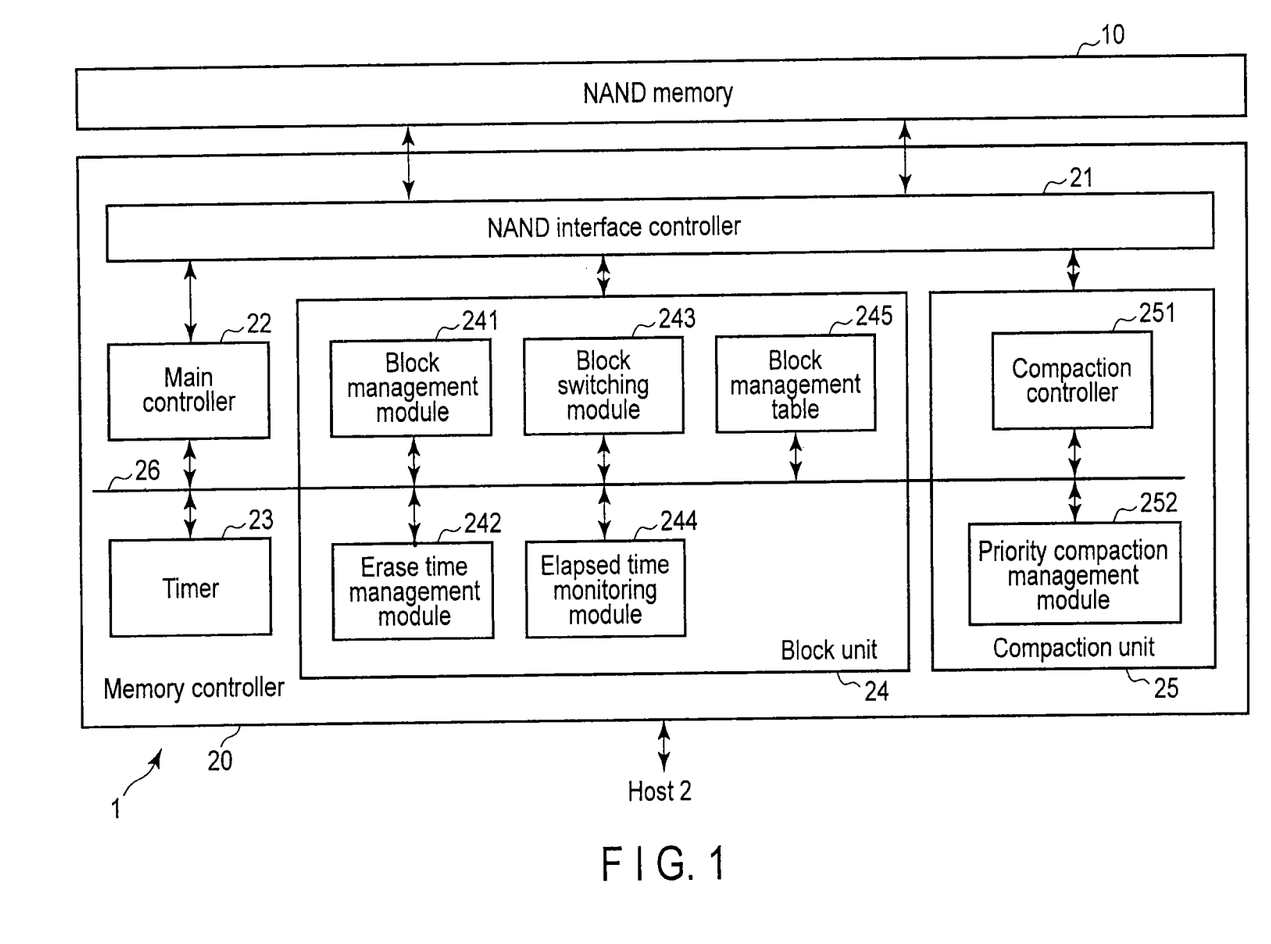
FIG. 1 is a block diagram showing an exemplary configuration of a memory system according to a first embodiment.

FIG. 1 is a block diagram showing the arrangement of a memory system according to the first embodiment. A memory system 1 shown in FIG. 1 comprises, for example, a NAND-type flash memory (to be referred to as a NAND memory hereinafter) 10 and a memory controller 20. The NAND memory 10 is configured to be parallelly accessible by the memory controller 20 via a plurality of channels (that is, multiple channels). In the first embodiment, the number of channels is 16, as will be described later.

The NAND memory 10 comprises, for example, a plurality of NAND memory chips. Each of the plurality of NAND memory chips comprises an array of memory cells. Each of the memory cells includes a floating gate, and the threshold voltage changes in accordance with the number of electrons accumulated in the floating gate. For this reason, each of the memory cells stores data based on the difference in the threshold voltage. In the first embodiment, each of the memory cells is a multilevel cell (MLC) that stores multivalued data (that is, data of two or more bits). Assume here that the multivalued data is quaternary data (that is, 2-bit data). However, each of the memory cell may be a single level cell (SLC) that stores binary data (that is, 1-bit data), that is, a binary level cell, or a multilevel cell (MLC) that stores multivalued data other than quaternary data.

The memory controller 20 comprises a NAND interface controller 21, a main controller 22, a timer 23, a block unit 24, a compaction unit 25, and an internal bus 26. Note that the memory controller 20 further comprises a host interface controller and a read/write controller, although not illustrated in FIG. 1. The host interface controller is connected to a host 2 (see FIG. 2) to be described later and receives a command (for example, a write command or a read command), an address, or the like transferred from the host 2. The host interface controller transfers the received command, address, or the like to the main controller 22. The host interface controller also controls data transfer between the host 2 and the memory system 1. On the other hand, the read/write controller controls data read/write.

The NAND interface controller 21 controls the NAND memory 10 under the control of the main controller 22, thereby accessing the NAND memory 10. The NAND interface controller 21 transfers and receives information about user data read/write between the NAND memory 10 and the main controller 22, block unit 24, and compaction unit 25.

The main controller 22 generally controls the plurality of modules in the memory controller 20, including the block unit 24 and the compaction unit 25. The timer 23 measures a time. In the first embodiment, the timer 23 measures the elapsed time from the activation time of the memory system 1.

The block unit 24 comprises a block management module 241, an erase time management module 242, a block switching module 243, an elapsed time monitoring module 244, and a block management table 245. The block management module 241 constructs a plurality of logical blocks using the NAND memory 10. The NAND memory 10 thus comprises a plurality of logical blocks. The arrangement of each of the plurality of logical blocks will be described later.

The erase time management module 242 manages the erase time of each of the plurality of logical blocks using the block management table 245. The erase time of a logical block is, for example, the time at which erase of data already written in the logical block (to be referred to as logical block erase hereinafter) has started. The erase time management module 242 acquires the measured value (that is, the elapsed time from the activation time of the memory system 1) of the timer 23 at the start of logical block erase as the erase time of the logical block. That is, the erase time used in the first embodiment is a relative time based on the activation time of the memory system 1.

If the probability of write error occurrence (to be referred to as a write error probability hereinafter) of a logical block currently in the writing state is high, the block switching module 243 switches the write destination logical block from the logical block in the writing state to another logical block (more specifically, free block). The free block will be described later. The elapsed time monitoring module 244 monitors (more specifically, periodically monitors) an elapsed time Telp from the erase time of the logical block currently in the writing state. The elapsed time monitoring module 244 also functions as a determination module. That is, the elapsed time monitoring module 244 determines, based on the elapsed time Telp, whether the write error probability of the logical block currently in the writing state is high, and notifies the block switching module 243 of the determination result.

The block management table 245 is used to manage, for each logical block, the state and erase time of the logical block. The block state will be described later. The block management table 245 is stored in, for example, a dynamic random access memory (DRAM). However, at the time of power shutdown of the memory system 1, the block management table 245 is saved in a rewritable nonvolatile memory such as a NAND memory. Upon activating the memory system 1, the block management table 245 is transferred from the rewritable nonvolatile memory to the DRAM. Note that the block management table 245 may be saved in the NAND memory 10. The block management table 245 may be stored in a volatile random access memory other than the DRAM. The block management table 245 may be stored in a nonvolatile random access memory such as a magnetoresistive random access memory (MRAM) or a ferroelectric random access memory (FeRAM). In this case, the above-described save at the time of power shutdown of the memory system 1 is unnecessary.

The compaction unit 25 comprises a compaction controller 251 and a priority compaction management module 252. The compaction controller 251 executes a process called compaction in order to effectively use the storage area of the NAND memory 10. The compaction will be described below.

In the NAND memory 10, data erase is performed in units of logical blocks, and data write is performed, to a logical block whose data has been erased, in units of storage areas (for example, logical pages) having a size smaller than that of the logical block, as will be described later. For this reason, if data rewrite progresses in the NAND memory 10, a plurality of logical blocks appear each including an area with valid data (that is, latest data) and an area with invalid data (data that is not latest). That is, the plurality of logical blocks appear in which the density of valid data is low. Details of the reason for this will be described below.

Assume that one logical block LB1 includes 128 logical pages PG0 to PG127 (see FIG. 4), as will be described later, and data (valid data) is written in the 128 logical pages PG0 to PG127. Assume that in this state, rewrite of data D0 in the logical page PG0 of the logical block LB1 is necessary. In the NAND memory 10, data rewrite cannot be done by data overwrite, as is known. For this reason, data RWD0 for rewrite of the data D0 is written in a block different from the logical block LB1. The data (valid data) D0 in the logical page PG0 of the logical block LB1 thus changes to invalid data. Next, assume that rewrite of data D10 in the logical page PG10 of the logical block LB1 is necessary. Data RWD10 for rewrite of the data D10 is written in a block different from the logical block LB1. The data (valid data) D10 in the logical page PG10 of the logical block LB1 thus changes to invalid data. Then, assume that rewrite of data D100 in the logical page PG100 of the logical block LB1 is necessary. Data RWD100 for rewrite of the data D100 is written in a block different from the logical block LB1. The data (valid data) D100 in the logical page PG100 of the logical block LB1 thus changes to invalid data. When data rewrite progresses in the NAND memory 10 in this way, for example, the logical block LB1 simultaneously includes areas with valid data and those with invalid data. That is, the density of valid data lowers in the logical block LB1.

The compaction executed by the compaction controller 251 is a process of collecting valid data (that is, latest data) of a plurality of logical blocks in which the valid data density is lower than a reference value and moving (rewriting) them to another logical block, thereby releasing the plurality of logical blocks.

The block management module 241 manages, for, for example, each logical page of a logical block, whether 64 physical blocks (see FIG. 4) included in the logical page are valid or invalid using a bitmap (bitmap table). The 64 physical blocks will be described later. A bitmap corresponding to one logical page is formed from 64 bits corresponding to 64 physical blocks. One logical block includes 128 logical pages, as will be described later. Hence, in the first embodiment, 128 bitmaps are used for one logical block. These bitmaps are stored in the DRAM together with the block management table 245.

The compaction controller 251 manages logical blocks that are compaction candidates and logical blocks under compaction processing by a list structure using the block identifiers (IDs) of the logical blocks. A list of logical blocks that are compaction candidates will be referred to as a compaction candidate block list. A list of logical blocks under compaction processing will be referred to as a compaction process block list. These lists are stored in the DRAM. These lists have, for example, a queue structure, and processing starts from the logical block at the start of the list (queue).

The compaction (data movement) controller 251 executes a compaction (data movement) process sequentially from the start logical block in the compaction process block list. When the number of logical blocks in the compaction process block list decreases along with the progress of the compaction process, the compaction controller 251 sequentially selects logical blocks that should be compaction sources from the compaction candidate block list beginning with the start candidate in the compaction candidate block list. The compaction controller 251 adds the selected logical blocks to the compaction process block list.

The priority compaction (priority data movement) management module 252 manages a logical block where the write has forcibly been ended by logical block switching of the block switching module 243 as a priority compaction (priority data movement) block. The priority compaction block is a logical block to be preferentially processed by the compaction controller 251.

In this embodiment, the block management module 241, the erase time management module 242, the block switching module 243, the elapsed time monitoring module 244, the compaction controller 251, and the priority compaction management module 252 are software modules implemented by causing one or more CPUs to execute predetermined programs (for example, firmware). However, some or all of them may be hardware modules.

Figure 2:
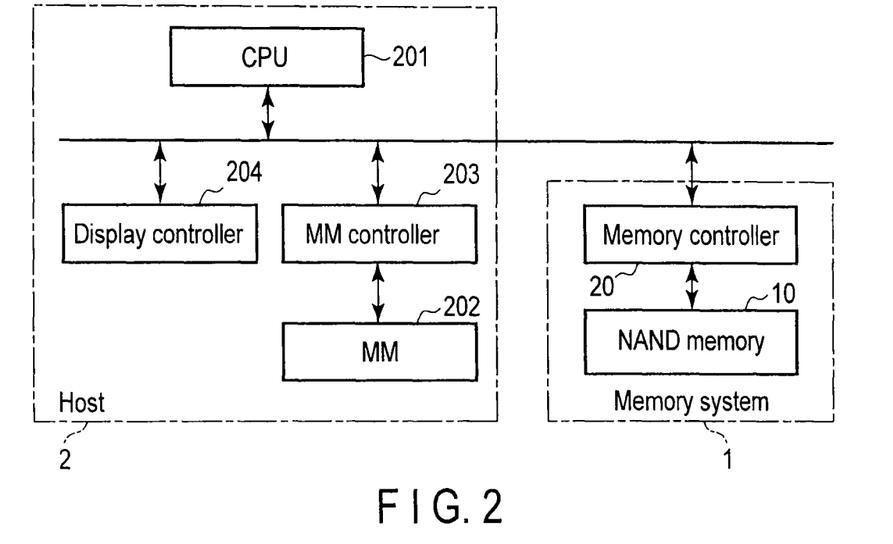
FIG. 2 is a block diagram showing an exemplary configuration of an electronic device including the memory system shown in FIG. 1.

FIG. 2 is a block diagram showing an exemplary configuration of an electronic device including the memory system 1 shown in FIG. 1. The electronic device shown in FIG. 2 includes the memory system 1 and the host device (to be referred to as a host hereinafter) 2. In the first embodiment, the electronic device shown in FIG. 2 is a personal computer, and the memory system 1 is a solid state drive (SSD). The host 2 uses the memory system 1 as its data storage device.

The host 2 comprises known elements such as a CPU 201, a main memory (MM) 202, an MM controller 203, and a display controller 204. Note that a communication interface controller generally provided in the host 2 is not illustrated in FIG. 2. The CPU 201 executes an operating system (OS) and various kinds of application programs. In the first embodiment, the OS and various kinds of application programs are loaded from a network to the MM 202 via the communication interface controller. In accordance with execution of the OS or an application program, the CPU 201 issues a read command or a write command to the memory system 1. Note that the host 2 may comprise two or more CPUs including the CPU 201.

The MM 202 comprises, for example, a plurality of DRAMs. The MM controller 203 controls access to the MM 202. The display controller 204 controls a flat panel display (not shown) such as a liquid crystal display or an organic electroluminescence (EL) display. Note that the electronic device shown in FIG. 2 need not always be a personal computer and may be, for example, a video camera, a music player, a portable terminal, a cellular phone, or a printer. The electronic device shown in FIG. 2 may comprise another data storage device, for example, a hard disk drive (HDD) in addition to the memory system 1. In this case, the OS and application programs may be stored in the HDD. In addition, the memory system 1 need not be the SSD and may be, for example, a memory card or a universal serial bus (USB) memory.

Figure 3:
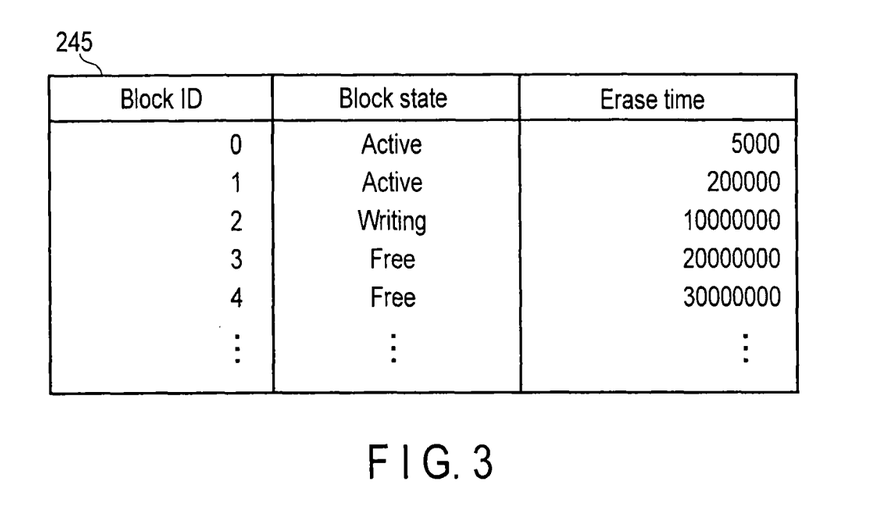
FIG. 3 is a view showing an exemplary data structure of a block management table shown in FIG. 1.

FIG. 3 illustrates an exemplary data structure of the block management table 245 shown in FIG. 1. Block management information to be used to manage a logical block is stored in the block management table 245 for each logical block. The block management information includes a block identifier (ID), block state information, and erase time information, as shown in FIG. 3.

The block ID is an identifier for identifying a corresponding logical block. The block state information represents the state of a corresponding logical block. The logical block state indicates one of write completion (active state), writing (writing state), and unwritten (free state). The write completion also includes a state in which a write is forcibly completed halfway. A free block (that is, a block in a data unwritten state) is, for example, a block released by compaction processing, and indicates a block in which all data are invalidated.

The erase time information represents the relative time of a point (erase start point) at which the latest erase of a corresponding logical block has started. The relative time represented by the erase time information will be described. In the first embodiment, the measured value of the timer 23 at the erase start point is used as the erase time information. As described above, the measured value of the timer 23 represents the elapsed time from the activation time of the memory system 1. Hence, the erase time information represents the relative time of the erase start point based on the activation time of the memory system 1.

As described above, the block management information stored in the block management table 245 for each logical block includes the erase time information. That is, the block management table 245 is also used as an erase time management table. The block management information further includes the page number of the last logical page (to be referred to as a write-completed page hereinafter) when write is completed, although not illustrated in FIG. 3.

Figure 4:
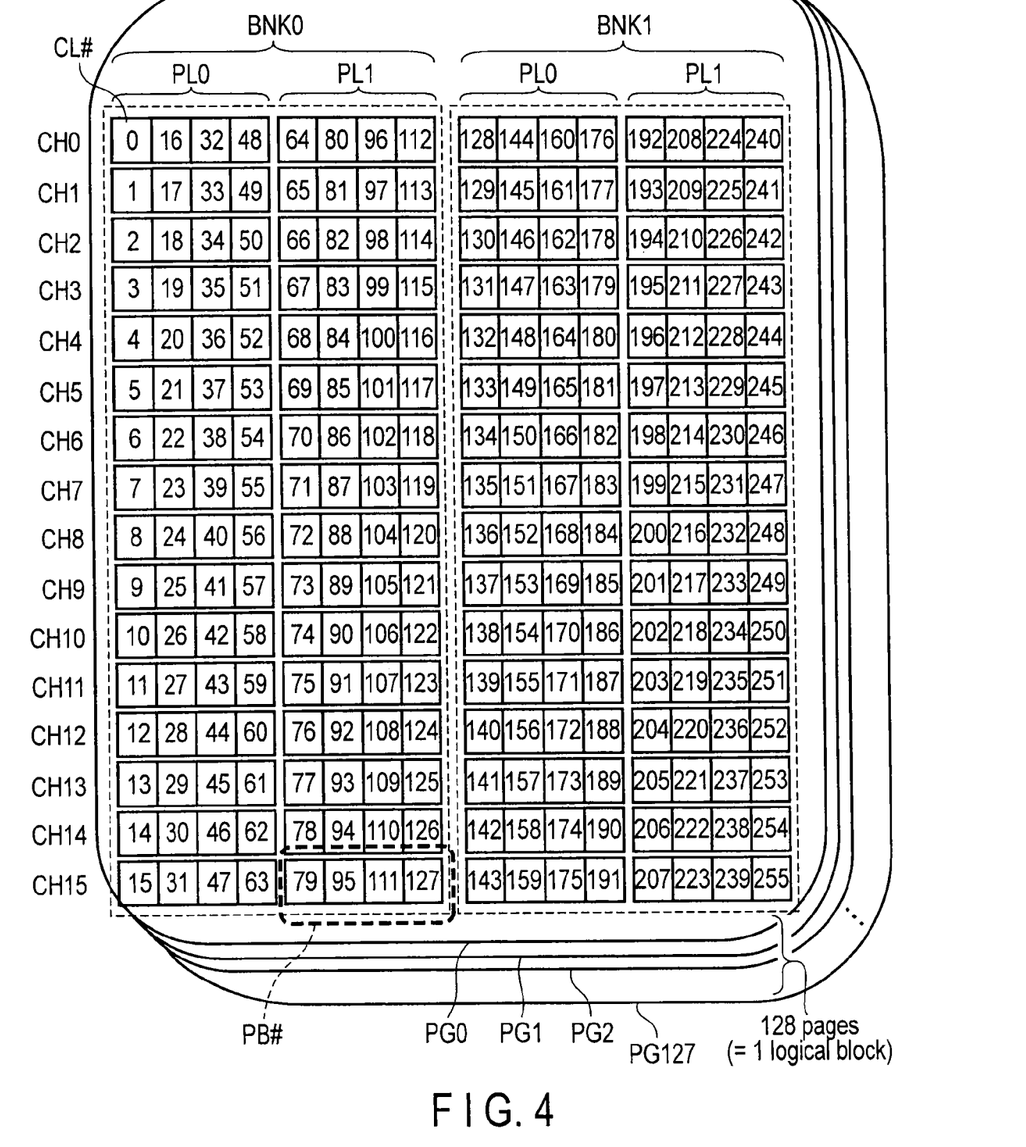
FIG. 4 is a view showing an exemplary arrangement of a logical block applied in the first embodiment.

FIG. 4 illustrates an exemplary arrangement of a logical block applied in the first embodiment. The logical block is the unit of data erase in the memory system 1. That is, in the memory system 1, data of logical blocks is erased for each of the logical blocks. The logical block includes a plurality of logical pages. In the first embodiment, the logical block includes 128 logical pages PG0 to PG127, as shown in FIG. 4. The page numbers of the logical pages PG0 to PG127 are, for example, 0 to 127.

A logical page PGi (i=0, 1, 2, ..., 127) is the unit of write/read set in the memory system 1. As shown in FIG. 4, the logical page PGi includes 64 physical blocks PB#="16 channels×2 banks×2 planes". The physical block PB# is the minimum unit of the physical storage area capable of independently performing data erase in the NAND memory 10.

A channel is a transmission path used for data transmission by the NAND interface controller 21. In the first embodiment, 16 channels CH0 to CH15 exist. The NAND memory 10 is configured to allow the parallel operation of the 16 channels CH0 to CH15. That is, the NAND interface controller 21 parallelly accesses the NAND memory 10 via the channels CH0 to CH15.

A bank is the unit of a NAND memory chip set corresponding to the channels CH0 to CH15. In the first embodiment, two banks BNK0 and BNK1 exist. The NAND memory chips corresponding to the banks BNK0 and BNK1 can perform a bank interleave operation by the banks BNK0 and BNK1.

A plane is a simultaneously accessible district in a single NAND memory chip. In the first embodiment, each of the plurality of NAND memory chips included in the NAND memory 10 has two planes PL0 and PL1. That is, each of the banks BNK0 and BNK1 includes the two planes PL0 and PL1. Each of the plurality of NAND memory chips can perform a parallel operation using the planes PL0 and PL1.

In this embodiment in which the logical page PGi includes the 64 physical blocks PB#="16 channels×2 banks×2 planes", one physical block PB# in the logical page PGi is designated by a combination of a channel number, a bank number, and a plane number. The physical block PB# includes, for example, four clusters CL#. A cluster is one unit of data management in the memory system 1 and includes, for example, a plurality of sectors. A sector is a minimum unit accessible from the host 2.

As is apparent from the above description, in the first embodiment, the NAND interface controller 21 can perform parallel access for each logical page PGi via the channels CH0 to CH15. More specifically, as for data write, the NAND interface controller 21 can write data to the NAND memory 10 simultaneously via the channels CH0 to CH15 for each logical page PGi (that is, 64 physical blocks at a time) under the control of the read/write controller. However, the control changes if one of the channels CH0 to CH15 is used as a parity channel for each logical page, as in a modification of the second embodiment to be described later. In such a case, the NAND interface controller 21 can simultaneously write data corresponding to 15 channels (that is, data of 60 physical blocks) out of the one logical page PGi to the NAND memory 10. On the other hand, as for data read, the NAND interface controller 21 can read data for each cluster under the control of the read/write controller.

The operation of the first embodiment will be described next by exemplifying an erase time management process and a write error prediction process. The write error prediction process includes a process of detecting a logical block with the highest write error probability. Note that in the following description, a logical block and a logical page will also simply be referred to as a block and a page.

Figure 5:
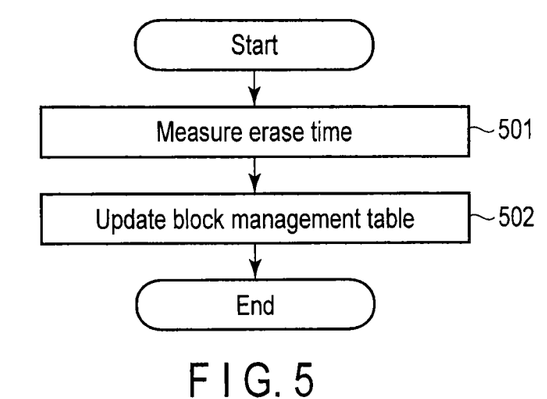
FIG. 5 is a flowchart showing an exemplary procedure of erase time management process applied in the first embodiment.

The erase time management process applied in the first embodiment will be explained first with reference to FIG. 5. FIG. 5 is a flowchart showing an exemplary procedure of the erase time management process. Assume that a block LBx is selected as a write destination block in accordance with a write request from the host 2. The block LBx is one of a plurality of blocks (that is, a plurality of free blocks) managed by the block management table 245 as blocks, the block states of which are free. In this case, the block management module 241 of the block unit 24 issues an instruction (that is, erase instruction) to erase the block LBx to the NAND interface controller 21. Based on this erase instruction, the NAND interface controller 21 starts an operation of erasing the block LBx. Note that the erase instruction may be issued by the main controller 22 or the read/write controller (not shown).

The erase time management module 242 monitors issuance of the erase instruction from the block management module 241. Upon detecting issuance of the erase instruction, the erase time management module 242 executes the erase time management process in accordance with the flowchart of FIG. 5. Note that the block management module 241 may notify the erase time management module 242 that the erase instruction has been issued to the NAND interface controller 21.

First, the erase time management module 242 acquires the current measured value of the timer 23 (that is, the measured value of the timer 23 at the start of erase of the block LBx) as the erase time of the block LBx (block 501). As described above, the acquired erase time is a relative time represented by the elapsed time from the activation time of the memory system 1.

Based on the acquired erase time and the block ID of the block LBx, the erase time management module 242 updates the block management information stored in the block management table 245 in the following way (block 502). Assume that the block ID of the block LBx is x. In this case, the erase time management module 242 looks up the block management table 245 to specify block management information (that is, the block management information of the block LBx) including x as a block ID. The erase time management module 242 updates the erase time information included in the block management information of the block LBx to represent the acquired erase time.

When erase of the block LBx is completed, the NAND interface controller 21 notifies the block management module 241 and the read/write controller of it. The block management module 241 updates the block state information included in the block management information of the block LBx to represent the writing state. On the other hand, upon receiving write data corresponding to the write request, which is transferred from the host 2, the read/write controller starts writing the data to the block LBx for each page via the NAND interface controller 21. Note that in accordance with the start of data write, the block management module 241 may update the block state information included in the block management information of the block LBx to represent the writing state. In addition, to discriminate a free block that has undergone erase from a free block that is yet to be erased, for example, a ready state representing a free block that has undergone erase may be added as a block state represented by the block state information.

Figure 6:
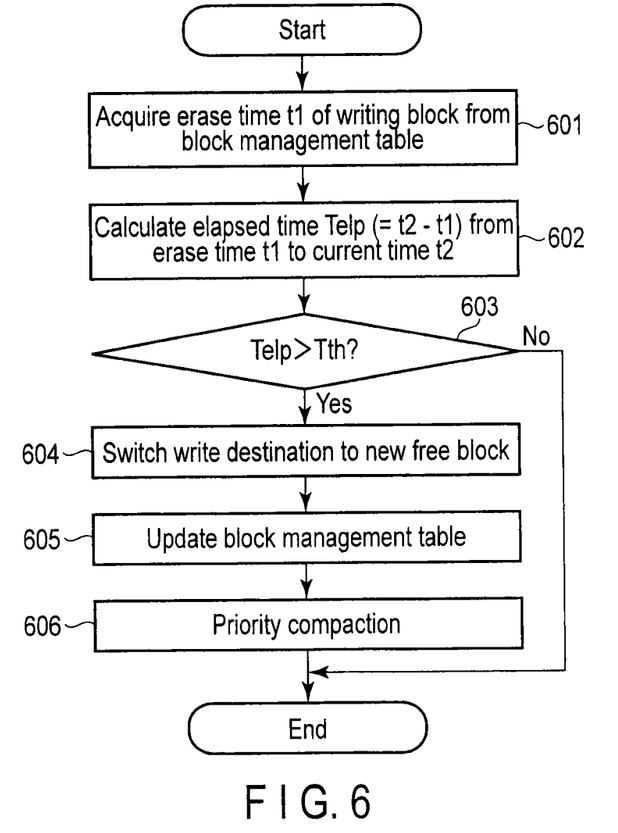
FIG. 6 is a flowchart showing an exemplary procedure of write error occurrence prediction process applied in the first embodiment.

The write error prediction process applied in the first embodiment will be described next with reference to FIG. 6. FIG. 6 is a flowchart showing an exemplary procedure of the write error prediction process. The main controller 22 activates the write error prediction process, for example, periodically based on the timer 23.

At the start of the write error prediction process, the elapsed time monitoring module 244 looks up the block management table 245 to specify a block (to be referred to as a writing block hereinafter) in the writing state (block 601). Assume here that a block LBy having y as a block ID is specified as the writing block. In block 601, the elapsed time monitoring module 244 acquires an erase time t1 from the block management information of the specified writing block.

Next, the elapsed time monitoring module 244 acquires a current time t2 (relative time) represented by the measured value of the timer 23, and calculates the elapsed time Telp from the erase time t1 to the current time t2 (block 602). The elapsed time Telp is represented by the difference (t2−t1) between the current time t2 and the erase time t1.

The elapsed time monitoring module 244 determines whether the elapsed time Telp has exceeded a reference time Tth (block 603). The present inventors have learned that in a NAND memory 10 having a small size, the time required from the erase time of a block to the completion of write of the block affects the state (for example, quality) of the block. In particular, the present inventors have found that the write error occurrence frequency (that is, write error probability) may rise in a block for which the write is not completed even after the elapse of a predetermined time from the erase time.

The reason for this will be explained below. Generally, guarantee of data retention (DR) in a NAND memory is defined by the elapsed time after the NAND memory is programmed (after data write). Erase of a block (more specifically, erase of data of a block) is an action for controlling to allow to recognize the number of electrons (that is, data storage state) accumulated in each of the floating gates of memory cells in the block as a predetermined potential (negative potential in general). However, if the memory cells are left to stand for a long time, the potential approaches zero. The memory cells cannot hold the erase state, and the DR margin lowers. On the other hand, the time in which the erase state can be held shortens along with the size reduction of the NAND memory. For this reason, it is necessary to control the time from the start of block erase to completion of programming (data write).

The above-described state (first state) in which the write is not completed even after the elapse of a predetermined time from the erase time occurs when, for example, the host 2 has interrupted data write in the block. In this case, the write error probability may rise when the data write from the host 2 to the block is resumed.

Hence, in block 603, the elapsed time monitoring module 244 compares the elapsed time Telp from the erase time t1 of the writing block LBy with the reference time Tth using the predetermined time as the reference time Tth. If the elapsed time Telp has not exceeded the reference time Tth (second state) (No in block 603), the elapsed time monitoring module 244 predicts (determines) that the probability (write error probability) that an error occurs in data write in the writing block LBy is low. In this case, the write error prediction process for one writing block ends. The write error prediction process is repeated for all writing blocks.

On the other hand, if the elapsed time Telp has exceeded the reference time Tth (first state) (Yes in block 603), the elapsed time monitoring module 244 predicts (determines) that the write error probability of the writing block LBy is high. That is, the elapsed time monitoring module 244 functions as a determination (detection) module, and detects a block LBy for which write is not completed even after the elapsed time Telp has exceeded the reference time Tth as a block having a high write error probability. In this case, the elapsed time monitoring module 244 notifies the block switching module 243 that the write error probability of the block LBy is high. Note that the determination (detection) module may be provided independently of the elapsed time monitoring module 244.

The block switching module 243 switches the write destination block from the block LBy currently in the writing state to another block (block 604). This write destination block switching will be described below in detail.

First, the block switching module 243 instructs, via the read/write controller, the NAND interface controller 21 to interrupt the data write in the block LBy and requests the block management module 241 to notify a free block. The NAND interface controller 21 thus interrupts the data write in the block LBy. More specifically, the NAND interface controller 21 ends the data write in the block LBy performed for each page halfway. Assume here that the data write in the block LBy ends when the write is completed from the start page PG0 to a halfway page PGj. The last page in which the write is completed, like the page PGj, will be referred to as a write-completed page.

On the other hand, the block management module 241 looks up the block management table 245 to search for a block whose block state is free. Assume that a block LBz having z as a block ID is found as a free block. The block management module 241 notifies the block switching module 243 of the found free block LBz. The block switching module 243 requests, via the read/write controller, the NAND interface controller 21 to set the free block LBz as a new write destination in place of the block LBy (that is, the block LBy for which the write has been interrupted). The NAND interface controller 21 thus executes the interrupted write for the block LBz. That is, the NAND interface controller 21 writes interrupted write data in the block LBz for each page. The NAND interface controller 21 also notifies the block management module 241 and the block switching module 243 of a page number j of the write-completed page PGj.

In accordance with the above-described block switching, the block management module 241 updates the block management information of the blocks LBy and LBz in the block management table 245 (block 605). More specifically, the block management module 241 updates the block state represented by the block management information of the block LBy (that is, original write destination block) from the writing state to the active state. The block management module 241 also sets the page number j of the write-completed page PGj in the block management information of the block LBy. The block management module 241 also updates the block state represented by the block management information of the block LBz (that is, new write destination block) from the free state to the writing state.

After switching the write destination block, as described above, the block switching module 243 acquires the page number j of the write-completed page PGj of the original write destination block LBy (that is, the block LBy for which the write has been ended halfway) from the NAND interface controller 21. The block switching module 243 notifies the priority compaction management module 252 of the compaction unit 25 of the block ID (=y) of the block LBy and the page number j of the write-completed page PGj.

The priority compaction management module 252 executes priority compaction for managing the block LBy for which the write has been ended halfway as a priority compaction block (block 606). That is, the priority compaction management module 252 causes the compaction controller 251 to preferentially use, in a compaction process, valid data within the range from the start page PG0 to the write-completed page PGj of the block LBy. For this purpose, the priority compaction management module 252 sets the block ID (=y) of the block LBy at, for example, the start of the compaction candidate block list.

Accordingly, in the compaction process of moving (rewriting) valid data of two or more blocks to another block, the compaction controller 251 preferentially moves the valid data within the range from the start page PG0 to the write-completed page PGj of the block LBy to the other block. In the first embodiment, for example, the valid data of the block LBy is shown in units of physical blocks by a bitmap prepared for each page of the block LBy. For this reason, the valid data within the range from the start page PG0 to the write-completed page PGj of the block LBy is shown by (j+1) bitmaps associated with the pages PG0 to PGj.

Note that the priority compaction management module 252 may set the block ID (=y) of the block LBy at the end of the compaction process block list. In addition, this setting may be executed by the compaction controller 251 in accordance with a request for the priority compaction management module 252.

The compaction controller 251 may manage, using a priority compaction candidate block list, the block that preferentially undergoes the compaction process. In this case, the compaction controller 251 or the priority compaction management module 252 may set the block ID (=y) of the block LBy at the end of the priority compaction candidate block list. The compaction controller 251 preferentially selects a compaction source from the priority compaction candidate block list.

According to the first embodiment, a block for which write is not completed even after the elapse of a predetermined time (reference time Tth) from the erase time can be detected as a block with a high probability of write error occurrence. That is, according to the first embodiment, it is possible to detect a block with a high probability of write error occurrence even when the data write count or the erase count is smaller than a predetermined count.

Additionally, the first embodiment uses a configuration wherein the erase time t1 of the block is stored in the block management table 245. For this reason, the elapsed time monitoring module 244 can calculate the elapsed time Telp from the erase time t1 of the block based on the difference between the erase time t1 and the relative time (current time) t2 represented by the measured value of the timer 23. If the elapsed time from the erase time should directly be measured by a timer, a timer needs to be prepared for each block in the writing state. Hence, according to the first embodiment, it is possible to acquire the elapsed time from the erase time of each block in the writing state by a simpler configuration.

In the first embodiment, write in a block detected as a block with a high probability of write error occurrence is ended halfway. This allows to prevent occurrence of a write error and to ensure high reliability of the NAND memory 10. However, data retention in the block for which the write has been ended halfway tends to degrade. This tendency becomes more conspicuous along with the size reduction of the NAND memory 10. Additionally, this tendency is more conspicuous in a NAND memory 10 using an MLC memory than in a NAND memory 10 using an SLC memory. As will be described later in detail, the SLC memory indicates a NAND memory 10 includes a plurality of SLCs, and the MLC memory indicates a NAND memory 10 includes a plurality of MLCs.

In the first embodiment, however, valid data in a block detected as a block with a high probability of write error occurrence is preferentially moved to another block. Hence, according to the first embodiment, it is possible to effectively cope with degradation of data retention of the block (more specifically, a plurality of memory cells included in the block) for which the write has been ended halfway, and to realize more robust data retention.

In the first embodiment, the erase time information is stored in the block management table 245 for all logical blocks. However, the erase time information need only be stored in the block management table 245 only for free blocks for which the erase has started and blocks in the writing state. In this case, the memory capacity necessary for storing the block management table 245 can be reduced.

First Modification of First Embodiment

A first modification of the first embodiment will be described next. In the first embodiment, the reference time Tth is constant. However, the probability of write error occurrence changes depending on the type of NAND memory 10. Examples of the types of NAND memory 10 are a first type in which a plurality of memory cells included in the NAND memory 10 are MLCs and a second type in which the plurality of memory cells included in the NAND memory 10 are SLCs. The NAND memory 10 of the first type will be referred to as an MLC memory, and the NAND memory 10 of the second type will be referred to as an SLC memory. The probability of write error occurrence is higher in the MLC memory. When the NAND memory 10 is an MLC memory, the probability of write error occurrence also changes depending on the use method of the NAND memory 10. When the NAND memory 10 is an MLC memory, the use methods include a first use method of using the NAND memory 10 as an MLC memory and a second use method of using the NAND memory 10 as a pseudo SLC memory. The pseudo SLC is a use method for writing data using only the least significant bit out of a plurality of bits held by each MLC of the NAND memory 10. The probability of write error occurrence is higher in the second use method (pseudo SLC memory) than in the first use method (MLC memory). That is, the use method means which bit of the plurality of bits holdable by each MLC is used to write data.

As the characteristic feature of the first modification of the first embodiment, the elapsed time monitoring module 244 (determination module) switches the reference time Tth in accordance with the type or use method of the NAND memory 10. To switch the reference time Tth, for example, the block unit 24 may include a reference time table in which the reference time Tth suitable for the type or use method of the NAND memory 10 is stored in association with the type or use method. Letting Tth1 and Tth2 be the reference times for the MLC memory and the SLC memory used as the NAND memory 10, respectively, Tth1≤Tth2 holds in general. Letting Tth0 be the reference time when the use method of the MLC memory (NAND memory 10) is pseudo SLC, Tth1≤Tth0 holds in general. Alternatively, the type or use method of the NAND memory 10 may identifiably be managed using, for example, the block management table 245.

As described above, in the first modification of the first embodiment, an appropriate reference time Tth is used in accordance with the type or use method of the NAND memory 10. Hence, according to the first modification of the first embodiment, it can be determined (predicted) more accurately, based on the type or use method of the NAND memory 10, whether the probability of write error occurrence upon data write in a block in the writing state (write destination block) is high.

Note that the types of NAND memory 10 may more finely be set. That is, the types of NAND memory 10 may be discriminated based on the number of values (number of bits) that can be stored by each memory cell of the NAND memory 10.

Second Modification of First Embodiment

A second modification of the first embodiment will be described next. In the first embodiment, the reference time Tth is constant. However, the probability of write error occurrence changes depending on the use frequency (or degree of use) of each block of the NAND memory 10. As the use frequency of each block, for example, the write count or erase count of the block is used.

As the characteristic feature of the second modification of the first embodiment, the elapsed time monitoring module 244 (determination module) switches the reference time Tth in accordance with the use frequency of each block of the NAND memory 10. To switch the reference time Tth, for example, the block unit 24 may comprise a reference time table in which, for each of predetermined use frequency ranges, the reference time Tth suitable for the range is stored. The higher the use frequency of a block is, the lower the reference time Tth to be used is. Hence, according to the second modification of the first embodiment, it can be detected more accurately, based on the use frequency of each block, whether the probability of write error occurrence upon data write in a block in the writing state is high.

Second Embodiment

In a recent memory system comprising a NAND memory, an error correction function of, when an error (that is, read error) has occurred at the time of data read, correcting the error is enhanced. On the other hand, along with the size reduction of the NAND memory, the frequency of error (that is, write error) occurrence in data write in a block tends to rise. If the write error frequency becomes high, a phenomenon in which correction (recovery) cannot sufficiently be done by the error correction function in data read (that is, a phenomenon in which error correction becomes impossible) occurs at a higher probability. This phenomenon is called a phenomenon of exceeding the error correction limit. As the characteristic feature of the second embodiment, the occurrence of the phenomenon of exceeding the error correction limit in data read from a block (to be referred to as a specific phenomenon hereinafter) is predicted (determined) based on the write error condition in data write in the block.

Figure 7:
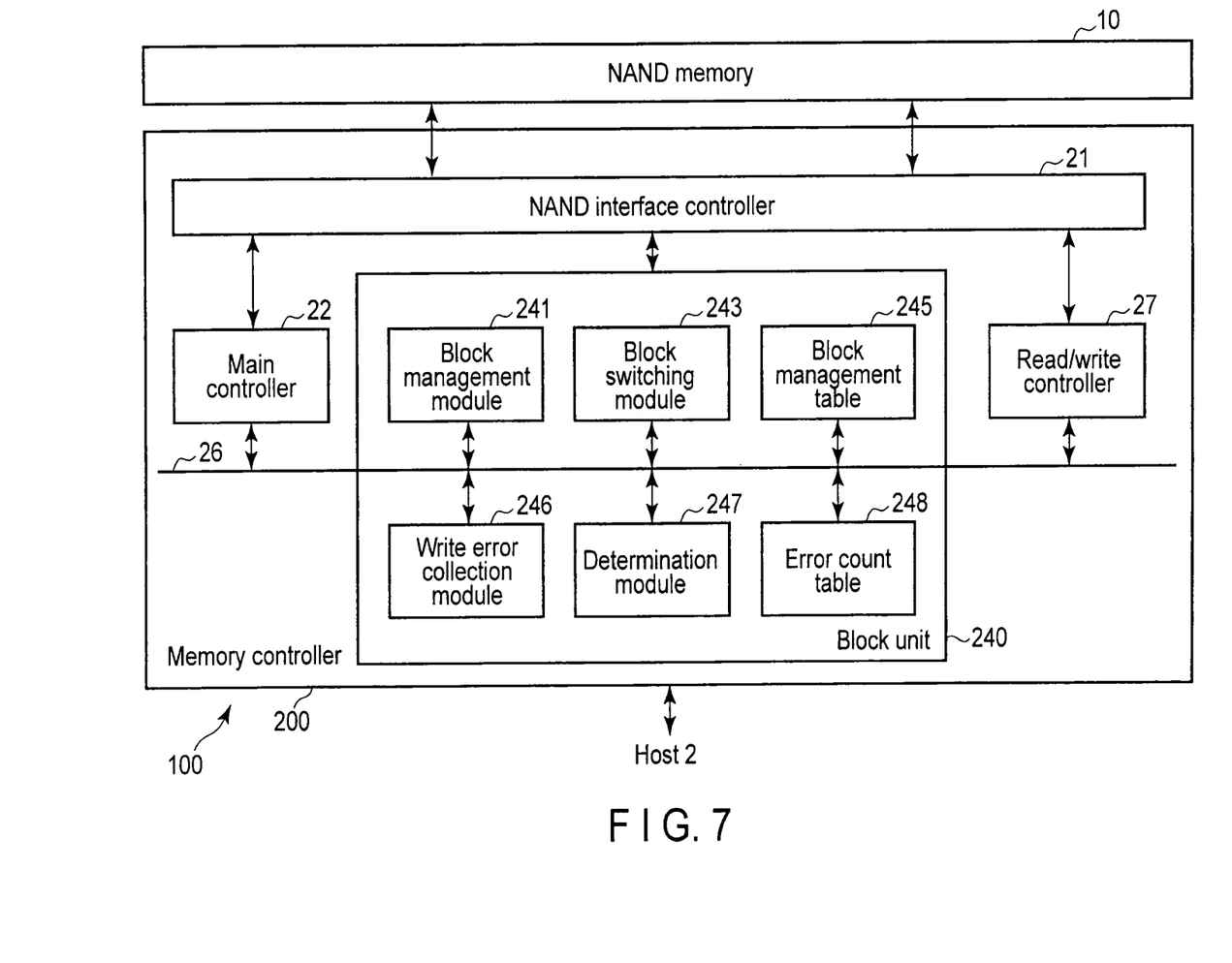
FIG. 7 is a block diagram showing an exemplary configuration of a memory system according to a second embodiment.

FIG. 7 is a block diagram showing an exemplary configuration of a memory system according to the second embodiment. The same reference numerals as in the memory system 1 shown in FIG. 1 denote the equivalent elements in FIG. 7. In the second embodiment, a memory system 100 shown in FIG. 7 is connected to a host 2 shown in FIG. 2 in place of the memory system 1 shown in FIG. 1.

The memory system 100 comprises a NAND memory 10 and a memory controller 200. The memory controller 200 comprises a NAND interface controller 21 and a main controller 22, as in the first embodiment. The memory controller 200 further comprises a block unit 240 corresponding to the block unit 24 shown in FIG. 1, and a read/write controller 27 that is not illustrated in FIG. 1.

The block unit 240 comprises a block management module 241, a block switching module 243, and a block management table 245, like the block unit 24 shown in FIG. 1. However, the function of the block switching module 243 is partially different from that in the first embodiment, as will be described later. In addition, block management information stored in the block management table 245 for each block need not always include erase time information, unlike the first embodiment. The block unit 240 further comprises a write error collection module 246, a determination module 247, and an error count table 248.

In accordance with a write error that has occurred in a period when data write in the NAND memory 10 is being performed, the write error collection module 246 acquires write error information representing the write error. The write error information includes at least a write error count. The write error collection module 246 updates the error count table 248 based on the acquired write error information (write error count). In this case, an error count C1 of a block where a write error has occurred is updated, as will be described later in detail.

Based on the error count C1 of a block in the writing state, the determination module 247 determines whether the probability that the specific phenomenon occurs in data read from the block is high. The block switching module 243 switches the write destination block from the block in the writing state to another block (more specifically, free block) based on the result of determination by the determination module 247.

Figure 8:
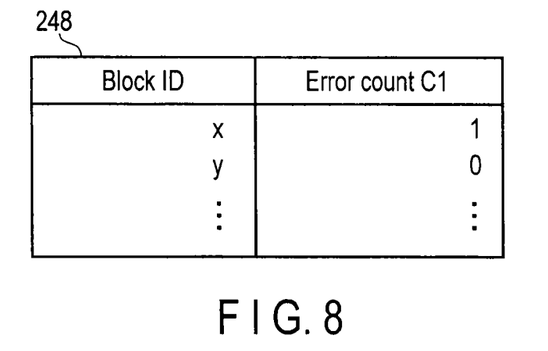
FIG. 8 is a view showing an exemplary data structure of an error count table shown in FIG. 7.

The error count C1 is stored in the error count table 248 for each block in the writing state in association with the block ID of the block. The error count C1 represents the accumulating total of write error counts of a corresponding block. FIG. 8 is a view showing an exemplary data structure of the error count table 248. The error count table 248 is stored in the DRAM, like the block management table 245.

Figure 9:
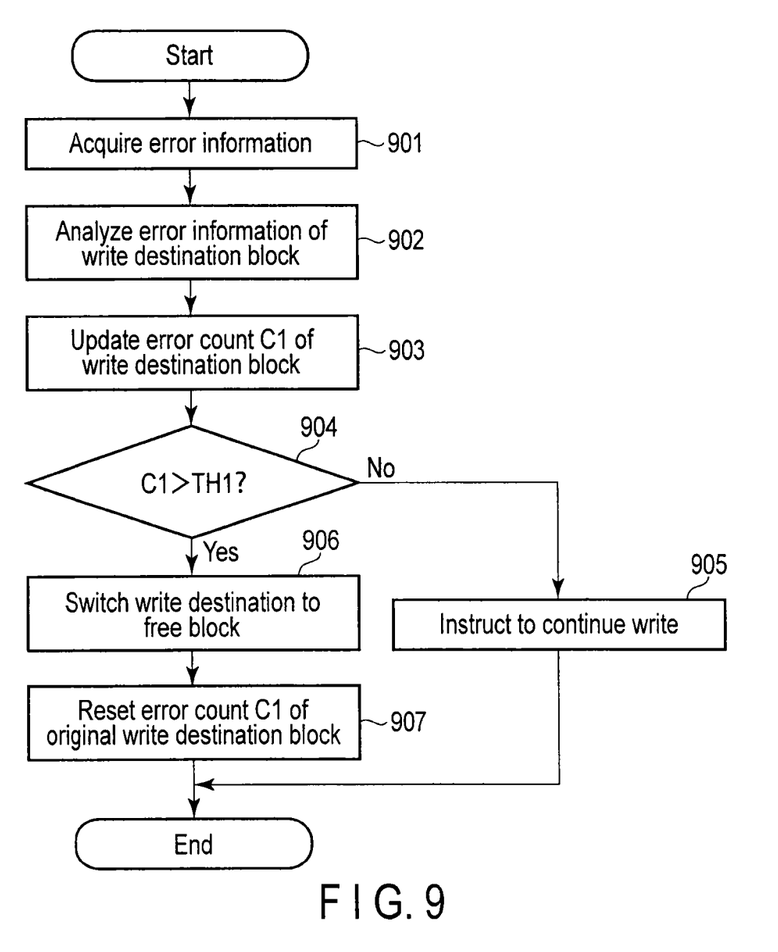
FIG. 9 is a flowchart showing an exemplary procedure of error correction limit prediction process applied in the second embodiment.

The operation of the second embodiment will be described next with reference to FIG. 9 by exemplifying an error correction limit prediction process. FIG. 9 is a flowchart showing an exemplary procedure of the error correction limit prediction process. The error correction limit prediction process is a process of predicting the occurrence of the specific phenomenon (that is, the phenomenon of exceeding the error correction limit).

Assume that the NAND interface controller 21 is writing data to the NAND memory 10 for each page under the control of the read/write controller 27. If a write error occurs in this state, the NAND interface controller 21 notifies, for example, the main controller 22 of write error information. This notification is called a write notification. The write error information includes a block ID, a page number, and a write error count. The block ID indicates the block (that is, write destination block) in the writing state to which a page with the error belongs, and the page number indicates the page. Assume here that the block ID is y (ID=y) indicating a block LBy. The write error count represents the number of physical blocks in which write errors have occurred in the page represented by the page number. Assume that the write error count is N. Note that the write error count may represent the number of clusters in which write errors have occurred in the page.

In accordance with the write error notification from the NAND interface controller 21, the main controller 22 activates the error correction limit prediction process. On the other hand, the NAND interface controller 21 stops write in the NAND memory 10 until determination concerning the error correction limit (specific phenomenon) ends.

At the start of the error correction limit prediction process, the write error collection module 246 acquires, from the main controller 22, the write error information notified by the NAND interface controller 21 (block 901). Note that the NAND interface controller 21 may notify the read/write controller 27 of the write error information. In this case, the write error collection module 246 acquires, via the read/write controller 27, the write error information notified by the NAND interface controller 21. The write error collection module 246 may acquire the write error information directly from the NAND interface controller 21.

The write error collection module 246 analyzes the acquired write error information (that is, the write error information of the write destination block) (block 902). The write error collection module 246 thus specifies the block LBy, in which the write error has occurred, and the write error count N.

The write error collection module 246 updates the error count table 248 based on the write error information analysis result (block 903). That is, the write error collection module 246 increments the error count C1 stored in the error count table 248 in association with the block ID (=y) of the block LBy in which the write error has occurred by the write error count N. The error count C1 is thus updated to C1=C1+N. In this way, the write error collection module 246 collects the write error information (more specifically, the write error count represented by the write error information) for each block and totalizes the counts. The write error collection module 246 notifies the determination module 247 of the latest error count C1 (that is, the totalization result) and the block ID (=y).

The determination module 247 compares the error count C1 notified by the write error collection module 246 with a reference value TH1, thereby determining whether the error count C1 has exceeded the reference value TH1 (block 904). If the error count C1 has not exceeded the reference value TH1 (No in block 904), the determination module 247 determines (predicts) that the probability that the specific phenomenon (that is, the phenomenon of exceeding the error correction limit) occurs in data read from the block LBy is low. On the other hand, if the error count C1 has exceeded the reference value TH1 (Yes in block 904), the determination module 247 determines (predicts) that the probability that the specific phenomenon occurs in data read from the block LBy is high. That is, the determination module 247 function as a detector, and detects the block LBy in which the probability that the specific phenomenon occurs in data read is high. The determination module 247 notifies the block switching module 243 of the determination (detection) result.

When the determination module 247 has determined that the probability that the specific phenomenon occurs is low, the block switching module 243 causes the NAND interface controller 21 to continue the write in the block LBy currently in the writing state via the read/write controller 27 (block 905). The block switching module 243 waits for occurrence of the next write error or completion of the data write in the block LBy.

On the other hand, when the determination module 247 has determined that the probability that the specific phenomenon occurs is high, the block switching module 243 switches the write destination block from the block LBy currently in the writing state to another block (block 906). That is, the block switching module 243 instructs the NAND interface controller 21 to interrupt the data write in the block LBy and requests the block management module 241 to notify a free block, as in the first embodiment.

The NAND interface controller 21 thus ends the data write in the block LBy performed for each page halfway. On the other hand, the block management module 241 notifies the block switching module 243 of the requested free block, for example, a block LBz. The block switching module 243 requests the NAND interface controller 21 to set the free block LBz as a new write destination in place of the block LBy. The NAND interface controller 21 thus executes the interrupted write for the block LBz.

In accordance with the block switching by the block switching module 243 (block 906), the write error collection module 246 resets the error count C1 stored in the error count table 248 in association with the block ID (=y) of the block LBy of the original write destination (block 907). The block switching module 243 waits for occurrence of a write error in data write in the new write destination block LBz or completion of the data write in the block LBz.

According to the second embodiment, it can be predicted (determined), based on the write error condition in a block in the writing state, whether the probability that the phenomenon of exceeding the error correction limit occurs in data read from the block is high. Additionally, according to the second embodiment, the write destination block is switched from the block for which the probability that the phenomenon of exceeding the error correction limit occurs is predicted to be high to another block. It is therefore possible to reduce the probability that a state in which error correction becomes impossible occurs in data read from the NAND memory 10 and to ensure high reliability of the NAND memory 10.

First Modification of Second Embodiment

A first modification of the second embodiment will be described next. In general, an error correcting code (ECC) is added to data written in the NAND memory 10 on the basis of a predetermined write unit (for example, in units of two clusters). At the time of data read from the NAND memory 10, an error (read error) of the read data is detected based on the ECC. If an error is detected, it is corrected based on the ECC. However, some errors cannot be corrected even using an ECC. To correct such an error, there has recently been developed a method called inter-channel error correction (to be referred to as ICP correction hereinafter).

In the first modification of the second embodiment, assume that the memory system 100 shown in FIG. 7 uses ICP correction. That is, in the first modification of the second embodiment, one of 16 channels CH0 to CH15 is used as an error correction channel, for example, for each page. One-page data (data other than error correction data) is distributed in the 15 channels other than the error correction channel. Based on the data distributed in the 15 channels, error correction data, for example, parity data is generated, and the generated parity data is stored in the error correction channel. For this reason, the error correction channel will be referred to as a parity channel.

In the memory system 100, even if an error that cannot be corrected using an ECC has occurred, the NAND interface controller 21 can restore, by ICP correction, the data of the channel (to be referred to as an error channel hereinafter) where the error has occurred. That is, the NAND interface controller 21 can restore the data of the error channel based on the data of the channels including the parity channel other than the error channel. However, if errors that cannot be corrected using an ECC have occurred in two or more channels concerning the data of one page, data restoration by ICP correction is difficult.

Figure 10:
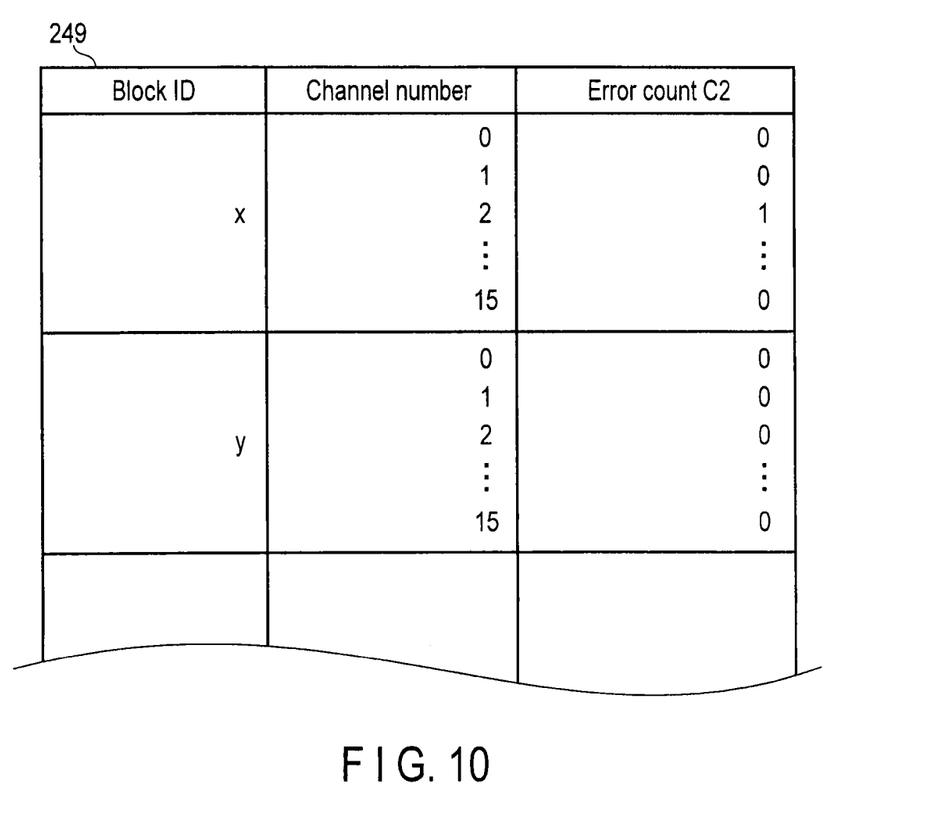
FIG. 10 is a view showing an exemplary data structure of an error count table applied in a first modification of the second embodiment.

As the characteristic feature of the first modification of the second embodiment, the phenomenon in which ICP correction becomes impossible is predicted as the specific phenomenon (phenomenon of exceeding the error correction limit). For this prediction, the determination module 247 uses an error count table 249 having a data structure shown in FIG. 10 in addition to the error count table 248 shown in FIG. 8. The error count table 249 is stored in the DRAM, like the error count table 248. An error count C2 is stored in the error count table 249 for each block in the writing state and for each channel. The error count C2 represents the accumulating total of write error counts for each channel of a corresponding block. Note that the determination module 247 may use one error count table in which the error count tables 248 and 249 are integrated (or merged).

Figure 11:
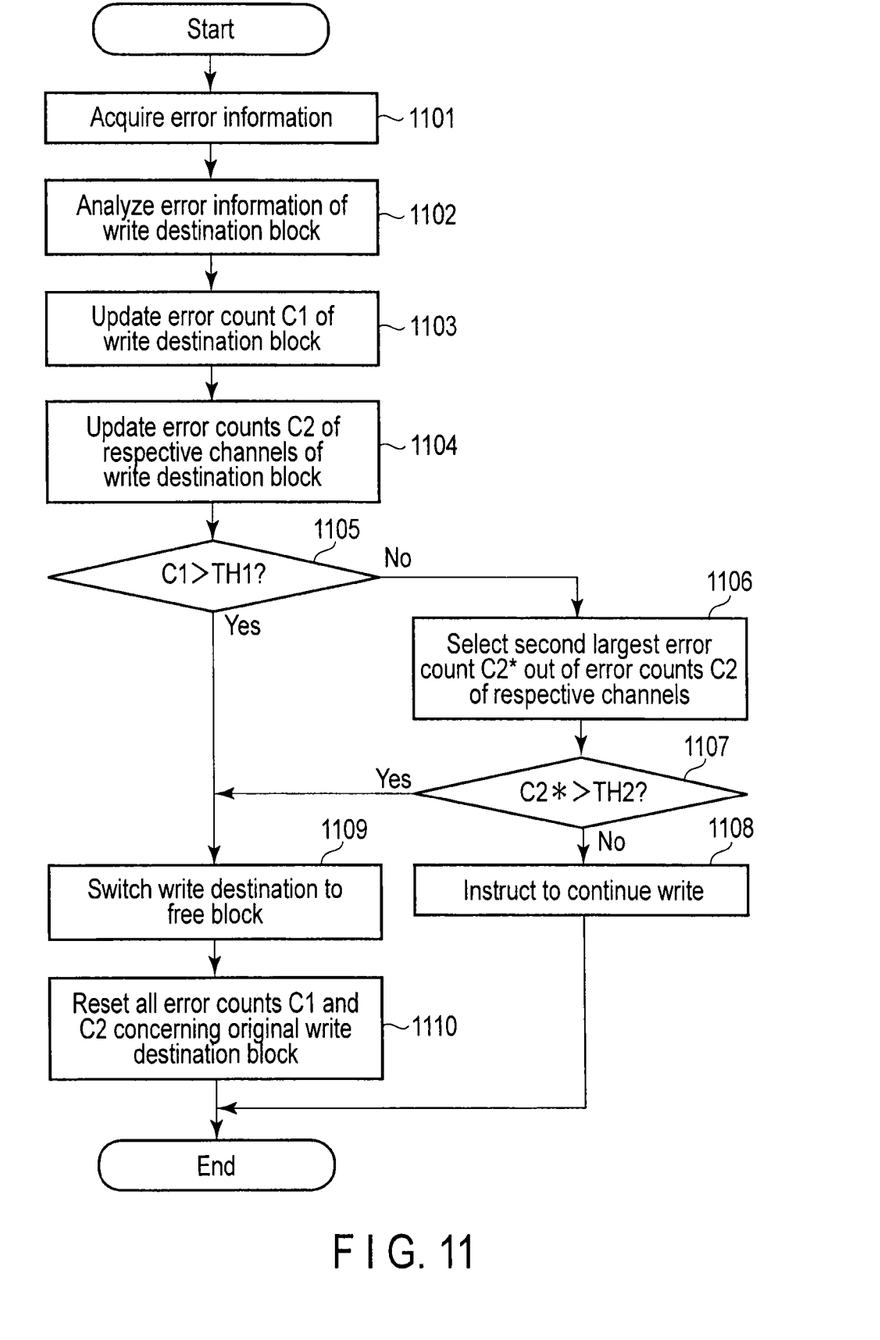
FIG. 11 is a flowchart showing an exemplary procedure of error correction limit prediction process applied in the first modification of the second embodiment.

The operation of the first modification of the second embodiment will be described next with reference to FIG. 11 by exemplifying an error correction limit prediction process. FIG. 11 is a flowchart showing an exemplary procedure of the error correction limit prediction process.

Assume that the NAND interface controller 21 is writing data in the NAND memory 10 on the page basis, as in the second embodiment. If a write error occurs in this state, the NAND interface controller 21 notifies, for example, the main controller 22 of write error information. Assume that the NAND interface controller 21 notifies the write error information for each page, unlike the second embodiment. In this case, the write error information includes a block ID, a page number, and a bitmap. The bitmap is formed from, for example, 64 bits, and represents the presence/absence of an error in each of 64 physical blocks included in the page represented by the page number. The position of each bit of the bitmap indicates the physical position of a corresponding physical block in the page. That is, the array of the 64 bits in the bitmap corresponds to the array of the 64 physical blocks, as shown in FIG. 4, in the page.

In accordance with the write error notification from the NAND interface controller 21, the main controller 22 activates the error correction limit prediction process. The write error collection module 246 acquires the write error information notified by the NAND interface controller 21 (block 1101). The write error collection module 246 then analyzes the acquired write error information (that is, the write error information of the write destination block) (block 1102). The write error collection module 246 thus specifies at least the block LBy in which the write error has occurred, the write error count N in the entire page of the block LBy, and write error counts N0 to N15 of the channels CH0 to CH15 in the page. The write error count N matches the number of bits representing errors in the bitmap included in the acquired write error information. On the other hand, the write error counts N0 to N15 are specified based on the bitmap and the array of the 64 physical blocks in each page shown in FIG. 4. N matches the sum of the write error counts N0 to N15.

The write error collection module 246 updates the error count table 248 based on the write error information analysis result (block 1103). That is, the write error collection module 246 increments the error count C1 stored in the error count table 248 in association with the block ID (=y) of the block LBy in which the write error has occurred by the write error count N. The error count C1 is thus updated to C1=C1+N.

The write error collection module 246 also updates the error count table 249 based on the write error information analysis result (block 1104). That is, the write error collection module 246 increments the error counts C2 stored in the error count table 249 in association with the block ID (=y) of the block LBy in which the write error has occurred and the channels CH0 to CH15 (channel numbers 0 to 15) by the write error counts N0 to N15. The error count C2 of a channel CHj having a page number j (j=0, 1, 2, ..., 15) is thus updated to C2=C2+Nj. The write error collection module 246 notifies the determination module 247 of the above-described latest error count C1, the latest error counts C2 of respective channels, and the block ID (=y).

The determination module 247 compares the error count C1 notified by the write error collection module 246 with the reference value TH1, thereby determining whether the error count C1 has exceeded the reference value TH1 (block 1105). If the error count C1 has not exceeded the reference value TH1 (No in block 1105), the determination module 247 selects the second largest error count C2* out of the error counts C2 of the channels CH0 to CH15 (block 1106).

The determination module 247 compares the selected error count C2* with a reference value TH2, thereby determining whether the error count C2* has exceeded the reference value TH2 (block 1107). The reference value TH2 is smaller than the reference value TH1. If the error count C2* has not exceeded the reference value TH2 (No in block 1107), the determination module 247 determines (predicts) that the probability that the specific phenomenon (phenomenon of exceeding the error correction limit) occurs in data read from the block LBy is low. In this case, the block switching module 243 causes the NAND interface controller 21 to continue the write in the block LBy currently in the writing state (block 1108). The block switching module 243 waits for occurrence of the next write error or completion of the data write in the block LBy.

On the other hand, if the error count C1 has exceeded the reference value TH1 (Yes in block 1105), the determination module 247 determines (predicts) that the possibility of the error correction limit in data read from the block LBy is high. Even when the error count C1 has not exceeded the reference value TH1 (No in block 1105), if the error count C2* has exceeded the reference value TH2 (Yes in block 1107), the determination module 247 determines (predicts) that the probability that the specific phenomenon (especially, the phenomenon in which ICP correction becomes impossible) occurs in data read from the block LBy is high. This is because the error count C2 has exceeded the reference value TH2 in at least two channels, and therefore, the probability that read errors occur simultaneously in at least two channels of the same page of the block LBy is high.

When the determination module 247 has determined that the probability is high, the block switching module 243 switches the write destination block from the block LBy currently in the writing state to another free block (for example, block LBz), as in block 906 of the second embodiment (block 1109). In accordance with the block switching by the block switching module 243 (block 1109), the write error collection module 246 resets all the error counts C1 and C2 stored in the error count tables 248 and 249 in association with the block LBy (ID=y) of the original write destination (block 1110). The block switching module 243 waits for the occurrence of a write error in data write in the new write destination block LBz or completion of the data write in the block LBz.

According to the above-described first modification of the second embodiment, the occurrence of the phenomenon in which ICP correction of a block in the writing state becomes impossible can be predicted based on the write error conditions of respective channels of the block. Additionally, according to the first modification of the second embodiment, the write destination block is switched from the block for which the probability that the phenomenon in which ICP correction becomes impossible is predicted to be high to another block. It is therefore possible to reduce the probability that ICP correction becomes impossible in data read from the NAND memory 10 and ensure high reliability of the NAND memory 10.

According to the first modification of the second embodiment, the write error condition in the write destination block can be analyzed at a grain size corresponding to each page. For this reason, it is possible to prevent write from being interrupted every time a write error occurs in the write destination block and to improve the block use efficiency as compared to the second embodiment.

Second Modification of Second Embodiment

A second modification of the second embodiment will be described next. As the characteristic feature of the second modification of the second embodiment, the determination module 247 dynamically switches (changes) the reference values TH1 and TH2 in accordance with the use frequency of each block. To switch the reference values TH1 and TH2, for example, the block unit 24 may comprise a reference value table in which, for each of predetermined use frequency ranges, the reference values TH1 and TH2 suitable for the range are stored.

According to the second embodiment, the memory system comprises a NAND-type flash memory and a memory controller. The NAND-type flash memory comprises a plurality of blocks. The memory controller controls the NAND-type flash memory. The memory controller comprises a collection module and a determination module. The collection module collects, on the block basis, write error information representing a write error that has occurred in data write in the NAND-type flash memory. Based on the collected write error information concerning a first block in the writing state out of the plurality of blocks, the determination module determines whether the probability that the phenomenon in which error correction becomes impossible in data read from the first block is high.

The memory controller may further comprise a block switching module that switches the write destination block from the first block to a second block out of the plurality of blocks upon determining that the probability is high.

The write error information may include a write error count. In this case, the collection module may totalize the write error counts of the first block based on the collected write error information concerning the first block, and the determination module may compare the totalized write error count with a reference value to determine whether the probability is high.

According to at least one embodiment described above, a block for which the probability that an error occurs in data write in the NAND-type flash memory is high can quickly be determined before actual occurrence of the error.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a NAND-type flash memory comprising a plurality of blocks; and
a memory controller configured to control the NAND-type flash memory,
wherein the memory controller comprises:
a monitoring module configured to acquire a time elapsed from a start of erase of data written in a first block before new data write in the first block is completed; and
a determination module configured to determine whether a probability that an error occurs in the data write in the first block is high, based on whether the elapsed time has exceeded a reference time associated with holding of erase state, before completion of the data write in the first block,
wherein the memory controller further comprises:
an erase time management module configured to store, in a table, erase time information representing a relative time measured in accordance with the start of the data erase of the first block;
a data movement controller configured to execute a data movement operation of moving first valid data from a plurality of blocks in the NAND-type flash memory in each of which comprises a first area where the first valid data is stored and a second area where first invalid data is stored to a third block that has undergone the data erase in the NAND-type flash memory, the first invalid data being data which is changed from second valid data and in which is invalidated by, in a state in which the second valid data is stored in the second area, writing update data for updating the second valid data in a fourth block that has undergone the data erase in the NAND-type flash memory; and
a priority data movement management module configured to, in the data movement operation by the data movement controller, preferentially move valid data from the first block for which the data write has been ended halfway.

2. The system of claim 1, wherein the determination module is further configured to switch the reference time in accordance with a type of the NAND-type flash memory or a use method of the NAND-type flash memory.

3. The system of claim 2, wherein:
types of the NAND-type flash memory include a first type in which the NAND-type flash memory comprises a plurality of multilevel memory cells and a second type in which the NAND-type flash memory comprises a plurality of single level cells, and
the use method of the NAND-type flash memory is based on whether to use the multilevel memory cells as pseudo single level memory cells when the NAND-type flash memory is of the first type.

4. The system of claim 2, wherein the memory controller further comprises a reference time table in which a reference time suitable for the type of the NAND-type flash memory or the use method of the NAND-type flash memory is stored in association with the type or the use method.

5. The system of claim 1, wherein the determination module is further configured to switch the reference time based on a write count of the first block or an erase count of the first block.

6. The system of claim 5, wherein the memory controller further comprises a reference time table in which, for each predetermined range of the write count or the erase count, a reference time suitable for the range is stored.

7. The system of claim 1, wherein the memory controller further comprises a block switching module configured to, upon determining that the probability that the error occurs is high, switch a write destination block from the first block to a second block that is in a data unwritten state in the NAND-type flash memory.

8. A memory controller for controlling a NAND-type flash memory, the NAND-type flash memory comprising a plurality of blocks, and each of the plurality of blocks being a unit of erase that needs to erase data already written in the block for data write in the block, the memory controller comprising:
a timer configured to measure a time, the timer starting measuring the time in accordance with activation of the memory system;
a table in which erase time information is stored, the erase time information representing a time at which data erase of a first block in the NAND-type flash memory has started in order to write data in the first block;
a monitoring module configured to acquire a difference between the time of the timer and the time represented by the erase time information stored in the table as an elapsed time from the start of the data erase of the first block;
a determination module configured to determine, based on whether the elapsed time has exceeded a reference time before completion of the data write in the first block, whether a probability that an error occurs in the data write in the first block due to an interrupt of the data write is high;
a block switching module configured to, upon determining that the probability that the error occurs is high, switch a write destination block from the first block to a second block that is in a data unwritten state in the NAND-type flash memory;
an erase time management module configured to store, in the table, the erase time information representing a relative time indicated by a measured value of the timer in accordance with the start of the data erase of the first block;
a data movement controller configured to execute a data movement operation of moving first valid data from a plurality of blocks in the NAND-type flash memory in each of which comprises a first area where the first valid data is stored and a second area where first invalid data is stored to a third block that has undergone the data erase in the NAND-type flash memory, the first invalid data being data which is changed from second valid data and in which is invalidated by, in a state in which the second valid data is stored in the second area, writing update data for updating the second valid data in a fourth block that has undergone the data erase in the NAND-type flash memory; and a priority data movement management module configured to, in the data movement operation by the data movement controller, preferentially move valid data from the first block for which the data write has been ended halfway by the switching.

9. The memory controller of claim 8, wherein the determination module is further configured to switch the reference time in accordance with a type of the NAND-type flash memory or a use method of the NAND-type flash memory.

10. The memory controller of claim 9, wherein:

types of the NAND-type flash memory include a first type in which the NAND-type flash memory comprises a plurality of multilevel memory cells and a second type in which the NAND-type flash memory comprises a plurality of single level cells, and the use method of the NAND-type flash memory is based on whether to use the multilevel memory cells as pseudo single level memory cells when the NAND-type flash memory is of the first type.

11. The memory controller of claim 9, further comprising a reference time table in which a reference time suitable for the type of the NAND-type flash memory or the use method of the NAND-type flash memory is stored in association with the type or the use method.

12. The memory controller of claim 8, wherein the determination module is further configured to switch the reference time based on a write count of the first block or an erase count of the first block.

13. The memory controller of claim 12, further comprising a reference time table in which, for each predetermined range of the write count or the erase count, a reference time suitable for the range is stored.

\* \* \* \* \*